United States Patent [19]
Horiguchi et al.

[11] Patent Number: 6,133,791
[45] Date of Patent: Oct. 17, 2000

[54] FEEDFORWARD AMPLIFIER WITH IMPROVED CHARACTERISTICS WITHOUT USING PILOT SIGNAL

[75] Inventors: Kenichi Horiguchi; Masatoshi Nakayama; Yukio Ikeda; Tadashi Takagi; Haruyasu Senda, all of Tokyo, Japan

[73] Assignee: Mitsubishi Denki Kabushiki Kaisha, Tokyo, Japan

[21] Appl. No.: 09/177,651

[22] Filed: Oct. 23, 1998

[30] Foreign Application Priority Data

Dec. 12, 1997 [JP] Japan .................................. 9-343484

[51] Int. Cl.$^7$ ...................................................... H03F 1/00
[52] U.S. Cl. ............................................. 330/151; 330/149
[58] Field of Search ..................................... 330/151, 149

[56] References Cited

U.S. PATENT DOCUMENTS

| | | | |
|---|---|---|---|
| 4,389,618 | 6/1983 | Bauman | 330/149 |
| 5,485,120 | 1/1996 | Anvari | 330/151 |
| 5,491,454 | 2/1996 | Matz | 330/149 |
| 5,877,653 | 3/1999 | Kim et al. | 330/149 |

FOREIGN PATENT DOCUMENTS

| | | |
|---|---|---|
| 1-198809 | 8/1989 | Japan . |
| 4-364602 | 12/1992 | Japan . |
| 5-235790 | 9/1993 | Japan . |

*Primary Examiner*—Robert Pascal
*Assistant Examiner*—Henry Choe

[57] ABSTRACT

A feedforward amplifier which includes a distortion detector, a distortion eliminator, an error power extractor, a first level detector and a first controller. The error power extractor extracts output error power due to variations in the distortion eliminator by combining the output signal from the distortion eliminator with the signal from a first linear signal path in the distortion detector in opposite phases. The first level detector detects the output error power extracted by the error power extractor, and the first controller controls a first variable attenuator and a first phase shifter which are interposed in the distortion eliminator such that the output error power is maintained at zero. This can solve a problem of a conventional feedforward amplifier in that the power level of the pilot signal must be increased to heighten the detection sensitivity of the pilot signal because the detection level of the pilot signal becomes minimum at an optimum operation point, and that the increasing power of the pilot signal degrades the communication quality of a system employing the conventional feedforward amplifier.

10 Claims, 14 Drawing Sheets

FEEDFORWARD AMPLIFIER WITH IMPROVED CHARACTERISTICS WITHOUT USING PILOT SIGNAL

BACKGROUND OF THE INVENTION

1. Field of the Invention

The present invention relates to a feedforward amplifier with linear, low distortion characteristics, which is used for satellite communications, terrestrial microwave communications, mobile communications and the like.

2. Description of Related Art

FIG. 12 is a block diagram showing a basic configuration of a first conventional feedforward amplifier disclosed in Japanese patent application laid-open No. 1-198809/1989. In FIG. 12, the reference numeral 1 designates a distortion detector, and 2 designates a distortion eliminator. The feedforward amplifier is mainly composed of the distortion detector 1 and distortion eliminator 2.

In the distortion detector 1, the reference numeral 3 designates a main amplifier signal path, 4 designates a first linear signal path, and 8 designates a directional coupler. In the main amplifier signal path 3, the reference numeral 9 designates a variable attenuator, 10 designates a variable phase shifter, 11 designates a main amplifier, and 12 designates a second pilot signal injector. In the first linear signal path 4, the reference numeral 17 designates a delay circuit.

In the distortion eliminator 2, the reference numeral 5 designates a main amplifier output path, 6 designates a distortion injection path, and 15 designates a directional coupler. In the main amplifier output path 5, the reference numeral 14 designates a delay circuit, and in the distortion injection path 6, the reference numeral 19 designates a directional coupler, 20 designates a variable attenuator, 21 designates a variable phase shifter and 22 designates a sub-amplifier.

The reference numeral 23 designates an input terminal of the feedforward amplifier, 24 designates an output terminal, and 16 designates a directional coupler connected between the distortion eliminator 2 and the output terminal 24.

The reference numeral 7 designates a first pilot signal injector for injecting to an input path a first pilot signal of a particular frequency, which is generated by a signal source 25; and 26 designates a signal source for injecting to the second pilot signal injector 12 a second pilot signal of a particular frequency. The reference numeral 27 designates a level detector that detects the level of the first pilot signal by observing the output level of the directional coupler 19 interposed in the distortion injection path 6; and 28 designates another level detector that detects the level of the second pilot signal by observing the output level of the directional coupler 16.

The reference numeral 29 designates a controller that controls the electrically controllable variable attenuator 9 and variable phase shifter 10 such that the output level of the level detector 27 becomes minimum, and controls the electrically controllable variable attenuator 20 and variable phase shifter 21 such that the output level of the level detector 28 becomes minimum.

Next, the operation of the first conventional feedforward amplifier will be described.

In the distortion detector 1, the input signal applied to the input terminal 23 and the first pilot signal of the particular frequency, which is generated by the signal source 25 and injected through the first pilot signal injector 7, are delivered to the main amplifier signal path 3 and the first linear signal path 4 by the directional coupler 8. The signal supplied to the main amplifier signal path 3 passes through the variable attenuator 9 and variable phase shifter 10, and is amplified by the main amplifier 11. The signal supplied to the first linear signal path 4 passes through the delay circuit 17 with a delay time identical to that of the main amplifier signal path 3.

The two signals passing through the two signal paths are supplied through the directional couplers 13 and 18 to the distortion injection path 6 of the distortion eliminator 2. Thus, the directional coupler 19 in the distortion injection path 6 and the level detector 27 detect the first pilot signal, and the controller 29 controls the variable attenuator 9 and variable phase shifter 10 such that the output level of the level detector 27 is kept minimum. This means that the variable attenuator 9 and variable phase shifter 10 are controlled such that the two signals are combined in the same amplitude and opposite phases in the distortion injection path 6 of the distortion eliminator 2 through the directional couplers 13 and 18.

Since the signal from the main amplifier signal path 3 consists of a linearly amplified signal plus nonlinear distortion components of the main amplifier 11, and the signal from the first linear signal path 4 consists of only a linear signal, and the two signals are combined in the same amplitude and opposite phases, the distortion injection path 6 detects only the nonlinear distortion components due to the main amplifier 11.

In the distortion eliminator 2, the signal supplied to the main amplifier output path 5 is the sum of the linearly amplified signal through the main amplifier 11, the nonlinear distortion components, and the second pilot signal of the particular frequency injected by the second pilot signal injector 12, whereas the signal supplied to the distortion injection path 6 is the sum of the nonlinear distortion components of the main amplifier 11 and the second pilot signal.

The delay amount of the delay circuit 14 is set equal to the delay amount of the distortion injection path 6 in advance. The directional coupler 15 combines the two signals passing through the two paths 5 and 6, and the directional coupler 16 and the level detector 28 detect the level of the second pilot signal.

In this case, the controller 29 controls the variable attenuator 20 and variable phase shifter 21 such that the output level of the level detector 28 is kept minimum. This means that the variable attenuator 20 and variable phase shifter 21 are controlled such that the two signals are combined by the directional coupler 15 in the same amplitude and opposite phases. Thus, the nonlinear distortion components added through the main amplifier output path 5 and the nonlinear distortion components added through the distortion injection path 6 are cancelled out at the output terminal 24, so that only the linearly amplified signal by the main amplifier 11 is produced from the output terminal 24.

As a result, controlling the variable attenuators 9 and 20, and the variable phase shifters 10 and 21 makes it possible to limit the degradation in the distortion characteristics of the feedforward amplifier mainly due to the characteristic changes in the main amplifier 11 and sub-amplifier 22 by variations in temperature and a supply voltage.

FIG. 13 is a block diagram showing a fundamental configuration of a second conventional feedforward amplifier disclosed in Japanese patent application laid-open No. 5-235790/1993. The feedforward amplifier employs, instead of the first pilot signal in the distortion detector 1 of the first conventional feedforward amplifier, one carrier selected from the input signal consisting a plurality of modulation signals.

In mobile communications, mobile stations search for a carrier of a control channel called a perch channel, which is sent from a base station in order to locate their own zone and communicate with the base station that provides a maximum receiving field. The base station normally transmits at a fixed maximum transmission power through the control channel, and hence its level does not change as the carriers of other communication channels.

In FIG. 13, reference numerals $30_1$–$30_n$ each designate a modulator producing one of modulation signals F1–Fn obtained by modulating carriers of different frequencies f1–fn. Here, it is assumed that the modulation signal Fm output from the m-th modulator $30_m$ is assigned to the control channel described above.

The reference numeral 31 designates a modulation signal combiner that combines the modulation signals F1–Fn, and supplies the combined signal to the feedforward amplifier, in which the directional coupler 19 detects the modulation signal Fm of the control channel, and the controller 29 controls the variable attenuator 9 and variable phase shifter 10 such that the output level of the level detector 27 is kept minimum.

Thus, the second conventional feedforward amplifier can achieve the same effect as the first conventional feedforward amplifier by utilizing one of the carries in the input signal consisting of the plurality of the modulation signals instead of the first pilot signal in the distortion detector 1 in the first conventional feedforward amplifier.

FIG. 14 is a block diagram showing a basic configuration of a third conventional feedforward amplifier disclosed in Japanese patent application laid-open No. 4-364602/1992.

Generally speaking, the feedforward amplifier consists of two interference circuits for signal cancellation and distortion cancellation, each of which can be represented by a model of a feedforward interference circuit as shown in FIG. 14. The feedforward interference circuit represents the distortion detector 1 or distortion eliminator 2 in the first conventional feedforward amplifier as shown in FIG. 12.

It comprises the directional coupler 8 for splitting the input signal supplied through the input terminal 23 into two power signals; two signal transfer paths 53 and 54 to which the two distributed signals are supplied; and the directional coupler 15 that combines power signals from the signal transfer paths 53 and 54 to be output through the output terminal 24. The signal transfer paths 53 includes the variable attenuator 9, the variable phase shifter 10 and an amplifier 55, and the signal transfer path 54 includes the delay circuit 17 and a phase inverter 40. Here, the amplifier 55 corresponds to the main amplifier 11 in the distortion detector 1, or to the sub-amplifier 22 in the distortion eliminator 2.

The first pilot signal fed from the signal source 25 is spectrum spread by a modulator 41 and is supplied to the first pilot signal injector 7. The modulator 41 comprises a phase modulator 43 and a band-pass filter 44. A demodulator 42 comprises a band-pass filter 45, a local oscillator 46, a phase modulator 47, a mixer 48 and a pilot band-pass filter 49. In addition, a pseudorandom (PN) generator 51 supplies the modulator 41 and demodulator 42 with PN signals, respectively, which are synchronized by a phase modulator 52.

Next, the operation of the third conventional feedforward amplifier will be described. The first pilot signal of a single frequency from the signal source 25 is phase modulated and spectrum spread by the phase modulator 43 using the PN code supplied from the pseudorandom (PN) generator 51, and the spread signal is injected to the input signal by the first pilot signal injector 7. The output of the first pilot signal injector 7 is supplied through the directional coupler 8 to the signal transfer paths 53 and 54 whose outputs are combined by the directional coupler 15. The directional coupler 16 extracts part of the output of the directional coupler 15.

The first pilot signal is demodulated by the demodulator 42 using the output of the phase modulator 47 that phase modulates and spectrum spreads the output of the local oscillator 46 using the PN code supplied from the pseudorandom (PN) generator 51. The level detector 28 detects the level of the demodulated first pilot signal. The controller 29 controls the variable attenuator 9 and variable phase shifter 10 such that the detection level of the first pilot signal is kept minimum.

With the foregoing arrangements, the conventional feedforward amplifiers use pilot signals for controlling the variable attenuator 9 or 20, and the variable phase shifter 10 or 21 in the distortion detector 1 or distortion eliminator 2.

The arrangements, however, have a problem of degrading the communication quality because the detection level of the pilot signals is minimum at the optimum operation point, and hence the power level of the pilot signal to be injected must be increased to heighten the detection sensitivity. In particular, when using the pilot signal in the distortion detector 1, the distortion eliminator 2 cannot remove the first pilot signal completely, leaving part of it in the output signal. Thus, a new circuit must be added to eliminate the first pilot signal, which presents a problem of increasing the circuit scale.

SUMMARY OF THE INVENTION

The present invention is implemented to solve the foregoing problems. It is therefore an object of the present invention to provide a feedforward amplifier capable of providing a high quality amplified signal with a small circuit scale.

According to one aspect of the present invention, there is provided a feedforward amplifier comprising: a distortion detector that includes a main amplifier signal path containing a main amplifier, and a first linear signal path containing a first delay circuit; a distortion eliminator that includes a main amplifier output path containing a second delay circuit, and a distortion injection path containing a first variable attenuator, first variable phase shifter and a sub-amplifier, and that cancels out nonlinear distortion components, which are generated by the main amplifier and detected by the distortion detector, by injecting into an output of the main amplifier an output of the sub-amplifier which amplifies the nonlinear distortion components; an error power extractor for extracting output error power due to variations in the distortion eliminator by combining in opposite phases an output signal of the distortion eliminator with a signal from the first linear signal path in the distortion detector; a first level detector for detecting the output error power extracted by the error power extractor; and a first controller for controlling the first variable attenuator and the first variable phase shifter in the distortion eliminator such that the output error power detected by the first level detector is maintained at a minimum.

Here, the error power extractor may comprise a second linear signal path that includes a second variable attenuator and a second variable phase shifter and is connected to the first linear signal path, and may extract, when an input signal to the feedforward amplifier includes a control channel signal and a main signal consisting of multiple carriers of different frequencies, the control channel signal, and the feedforward amplifier may further comprise a second level detector for detecting the control channel signal extracted by the error power extractor; and a second controller for controlling the second variable attenuator and the second variable phase shifter in the error power extractor such that the control channel signal detected by the second level detector is maintained at a minimum.

The main amplifier signal path may further include a third variable attenuator and a third variable phase shifter, and the feedforward amplifier may further comprise a third level detector for detecting, when an input signal to the feedforward amplifier includes a control channel signal and a main signal consisting of multiple carriers of different frequencies, the control channel signal from the distortion injection circuit; and a third controller for controlling the third variable attenuator and the third variable phase shifter in the main amplifier signal path such that the control channel signal detected by the third level detector is maintained at a minimum.

The error power extractor may comprise a second linear signal path that includes a second variable attenuator and a second variable phase shifter and is connected to the first linear signal path, and may extract the control channel signal, and the feedforward amplifier may further comprise a second level detector for detecting the control channel signal extracted by the error power extractor; and a second controller for controlling the second variable attenuator and the second variable phase shifter in the second linear signal path such that the control channel signal detected by the second level detector is maintained at a minimum.

The feedforward amplifier may further comprise a first demodulator that extracts, when a CDMA modulation signal which includes the control channel signal and the main signal consisting of multiple channel signals is used as the input signal, a CDMA modulation signal corresponding to the control channel signal from the distortion injection circuit, may demodulate the extracted CDMA modulation signal, and may supply it to the third level detector.

The error power extractor may extract, when using as the input signal a CDMA modulation signal including the control channel signal and the main signal containing multiple channel signals, a CDMA modulation signal corresponding to the control channel signal, and the feedforward amplifier may further comprise a second demodulator for demodulating the CDMA modulation signal extracted by the error power extractor, and may supply the demodulated signal to the second level detector.

The main amplifier signal path of the distortion detector may further include a third variable attenuator and a third variable phase shifter; the error power extractor may include a second linear signal path that is connected to the first linear signal path and includes a second linear signal path containing a second attenuator and a second variable phase shifter, and the feedforward amplifier may further comprise: a switching circuit for selecting, when using as an input signal a CDMA modulation signal including a control channel signal and a main signal containing multiple channel signals, a CDMA modulation signal corresponding to the control channel signal from one of the distortion injection path and the error power extractor; a fourth demodulator for demodulating the CDMA modulation signal selected by the switching circuit; a fourth level detector for detecting the CDMA modulation signal demodulated by the fourth demodulator; and a fourth controller for controlling, when the switching circuit selects the CDMA modulation signal from the error power extractor, the second variable attenuator and the second variable phase shifter which are interposed in the second linear signal path such that the CDMA modulation signal detected by the fourth level detector is kept minimum, and for controlling, when the switching circuit selects the CDMA modulation signal from the distortion injection path, the third variable attenuator and the third variable phase shifter which are interposed in the main amplifier signal path such that the CDMA modulation signal detected by the fourth level detector is kept minimum.

The main amplifier signal path in the distortion detector may further include a third variable attenuator; and the first linear signal path in the distortion detector may further include a fourth variable attenuator and a fourth variable phase shifter, and the feedforward amplifier may further comprise: a fifth level detector for detecting the control channel signal from the distortion injection path; a fifth controller for controlling the fourth variable attenuator and the fourth variable phase shifter which are interposed in the first linear signal path such that the control channel signal detected by the fifth level detector is maintained at a minimum; a sixth level detector for detecting an output signal of the distortion eliminator; and a sixth controller for controlling the third variable attenuator which is interposed in the main amplifier signal path such that the output signal detected by the sixth level detector is maintained at a fixed value.

The error power extractor may extract, when using as the input signal a CDMA modulation signal including the control channel signal and the main signal containing multiple channel signals, a CDMA modulation signal corresponding to the control channel signal, and the feedforward amplifier may further comprise a second demodulator for demodulating the CDMA modulation signal extracted by the error power extractor, and may supply the demodulated signal to the second level detector.

The main amplifier signal path of the distortion detector may further comprise a first linearizer for compensating for distortion characteristics of the main amplifier.

The distortion injection path of the distortion eliminator may further comprise a second linearizer for compensating for distortion characteristics of the subamplifier.

The feedforward amplifier may further comprise a first demodulator that extracts from the distortion injection circuit the CDMA modulation signal corresponding to the control channel signal, demodulates the extracted CDMA modulation signal, and supplies it to the third level detector.

DETAILED DESCRIPTION OF THE PREFERRED EMBODIMENTS

The invention will now be described with reference to the accompanying drawings.

Embodiment 1

Figure 1:
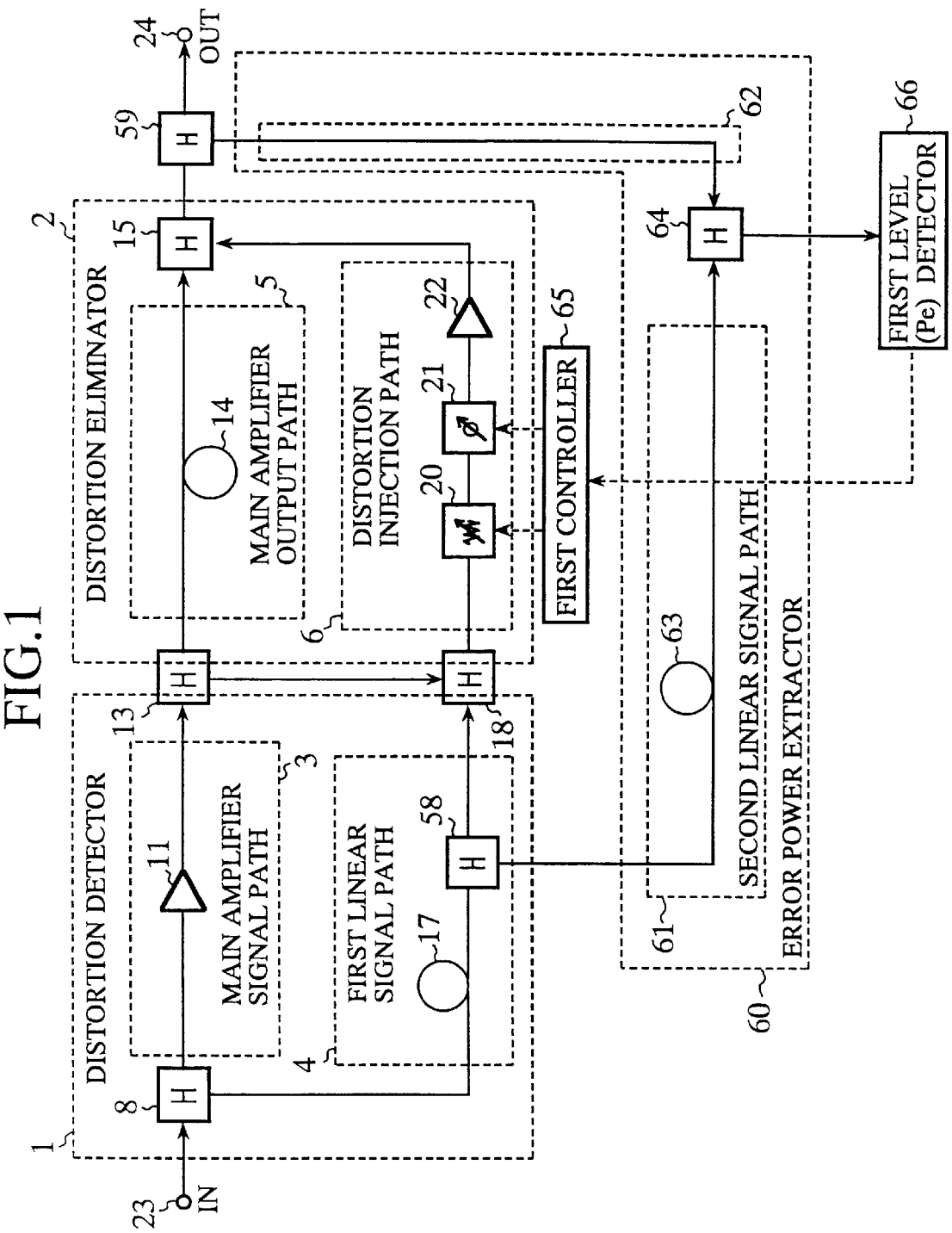
FIG. 1 is a block diagram showing embodiment 1 of a feedforward amplifier in accordance with the present invention.

FIG. 1 is a block diagram showing a configuration of embodiment 1 of a feedforward amplifier in accordance with the present invention. In FIG. 1, the reference numeral 1 designates a distortion detector, 2 designates a distortion eliminator, and 60 designates an error power extractor. The feedforward amplifier is mainly composed of the distortion detector 1, distortion eliminator 2 and error power extractor 60.

In the distortion detector 1, the reference numeral 8 designates a directional coupler, 3 designates a main amplifier signal path, and 4 designates a first linear signal path, in which the main amplifier signal path 3 consists of the main amplifier 11 and the first linear signal path 4 consists of the delay circuit 17 and a directional coupler 58.

In the distortion eliminator 2, the reference numeral 5 designates a main amplifier output path, 6 designates a distortion injection path, and 15 designates a directional coupler for injecting the output signal of the distortion injection path 6 into the output signal of the main amplifier output path 5. The reference numerals 13 and 18 each designate a directional coupler interposed between the distortion detector 1 and distortion eliminator 2. The main amplifier output path 5 consists of the delay circuit 14, and the distortion injection path 6 consists of the first variable attenuator 20, first variable phase shifter 21 and sub-amplifier 22.

In the error power extractor 60, the reference numeral 61 designates a second linear signal path, 62 designates an output reference path, and 64 designates a directional coupler for combining the output of the second linear signal path 61 with that of the output reference path 62 in the same amplitude and opposite phases. The second linear signal path 61 consists of a delay circuit 63.

The reference numeral 66 designates a first level (Pe) detector for detecting the combined output from the directional coupler 64, and 65 designates a first controller for controlling the electrically controllable first variable attenuator 20 and first variable phase shifter 21 such that the detection value output from the first level (Pe) detector 66 is kept minimum.

The reference numeral 23 designates an input terminal of the feedforward amplifier, 24 designates an output terminal, and 59 designates a directional coupler connected between the distortion eliminator 2 and the output terminal 24.

Next, the operation of embodiment 1 will be described.

In the distortion detector 1, the input signal applied to the input terminal 23 is delivered to the main amplifier signal path 3 and first linear signal path 4 through the directional coupler 8. The signal supplied to the main amplifier signal path 3 is amplified by the main amplifier 11. The signal supplied to the first linear signal path 4 passes through the delay circuit 17 with the same delay time as that of the main amplifier signal path 3. The two signals passing through the two signal paths are combined through the directional couplers 13 and 18 in the same amplitude and opposite phases, and supplied to the distortion injection path 6 of the distortion eliminator 2.

Since the signal from the main amplifier signal path 3 consists of a linearly amplified signal plus nonlinear distortion components of the main amplifier 11, and the signal from the first linear signal path 4 consists of only a linear signal, and the two signals are combined in the same amplitude and opposite phases, the distortion injection path 6 detects only the nonlinear distortion components added by the main amplifier 11.

In the distortion eliminator 2, the signal supplied to the main amplifier output path 5 is the signal amplified by the main amplifier 11, whereas the signal supplied to the distortion injection path 6 is the nonlinear distortion components of the main amplifier 11.

The delay amount of the delay circuit 14 is set equal to the delay amount of the distortion injection path 6 in advance. The values of the first variable attenuator 20 and first variable phase shifter 21 are initially set such that the directional coupler 15 combines the two signals passing through the two paths 5 and 6 in the same amplitude and opposite phases.

In this initial state, the delay amount of the delay circuit 63 in the error power extractor 60 is set equal to that of the distortion injection path 6, and the output of the output reference path 62 is combined with that of the second linear signal path 61 by the directional coupler 64 in the same amplitude and opposite phases. The combined power (Pe) is supplied to the first level (Pe) detector 66, and the first controller 65 controls the first variable attenuator 20 and first variable phase shifter 21 such that the detection value of the first level (Pe) detector 66 is maintained at a minimum.

According to embodiment 1, since the pilot signals are removed, the signal sources for generating the pilot signals can be obviated, which serves to reduce the size of the device.

Furthermore, the distortion characteristics of the feedforward amplifier can be maintained at the initial state level against the changes in the characteristics of the sub-amplifier 22 due to the variations in the temperature, supply voltage and the like. In other words, the present embodiment 1 can maintain the feedforward amplifier at its optimum distortion state.

Embodiment 2

Figure 2:
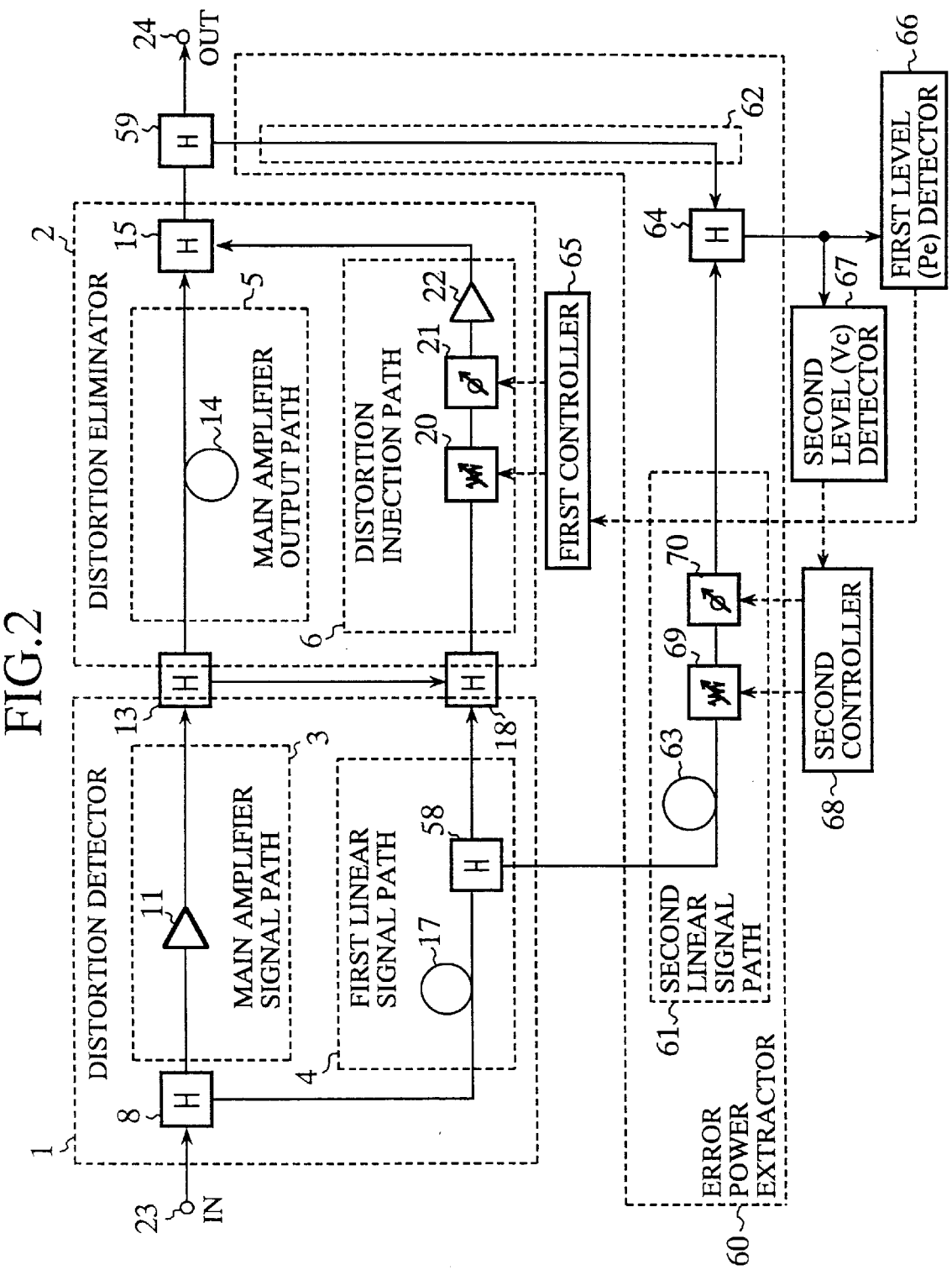
FIG. 2 is a block diagram showing embodiment 2 of the feedforward amplifier in accordance with the present invention.

FIG. 2 is a block diagram showing a configuration of embodiment 2 of the feedforward amplifier in accordance with the present invention, in which the second linear signal path 61 in the error power extractor 60 includes a second variable attenuator 69 and a second variable phase shifter 70 besides the delay circuit 63.

The reference numeral 67 designates a second level (Vc) detector that detects, when the input signal is composed of a control channel signal (Vc) and a main signal (Vs) consisting of multiple carriers of different frequencies, the control channel signal (Vc) included in the combined output from the directional coupler 64; and 68 designates a second controller for controlling the electrically controllable second variable attenuator 69 and second variable phase shifter 70 such that the detection value of the second level (Vc) detector 67 is kept minimum. Since the remaining configuration is the same as that of the embodiment 1, the duplicate description is avoided here.

Next, the operation of embodiment 2 will be described.

In embodiment 2, it is assumed that the input signal includes the control channel signal (Vc) and the main signal (Vs) consisting of the multiple carriers of different frequencies. Thus, the second level (Vc) detector 67 detects the control channel signal (Vs) contained in the combined output from the directional coupler 64 in the error power extractor 60. Then, the second controller 68 controls the second variable attenuator 69 and second variable phase shifter 70 such that the detection output of the second level (Vc) detector 67 is maintained at a minimum.

According to embodiment 2, the directional coupler 64 can always combine the output of the output reference path 62 with that of the second linear signal path 61 in the same amplitude and opposite phases, and hence the accuracy of the first level (Pe) detector 66 can be maintained at a fixed value independently of the amplitude and phase errors due to the variations in characteristics of the output reference path 62 and second linear signal path 61 in the error power extractor 60. This makes possible maintaining the distortion characteristics of the feedforward amplifier at an optimum state. The other advantages are similar to those of the foregoing embodiment 1.

Embodiment 3

Figure 3:
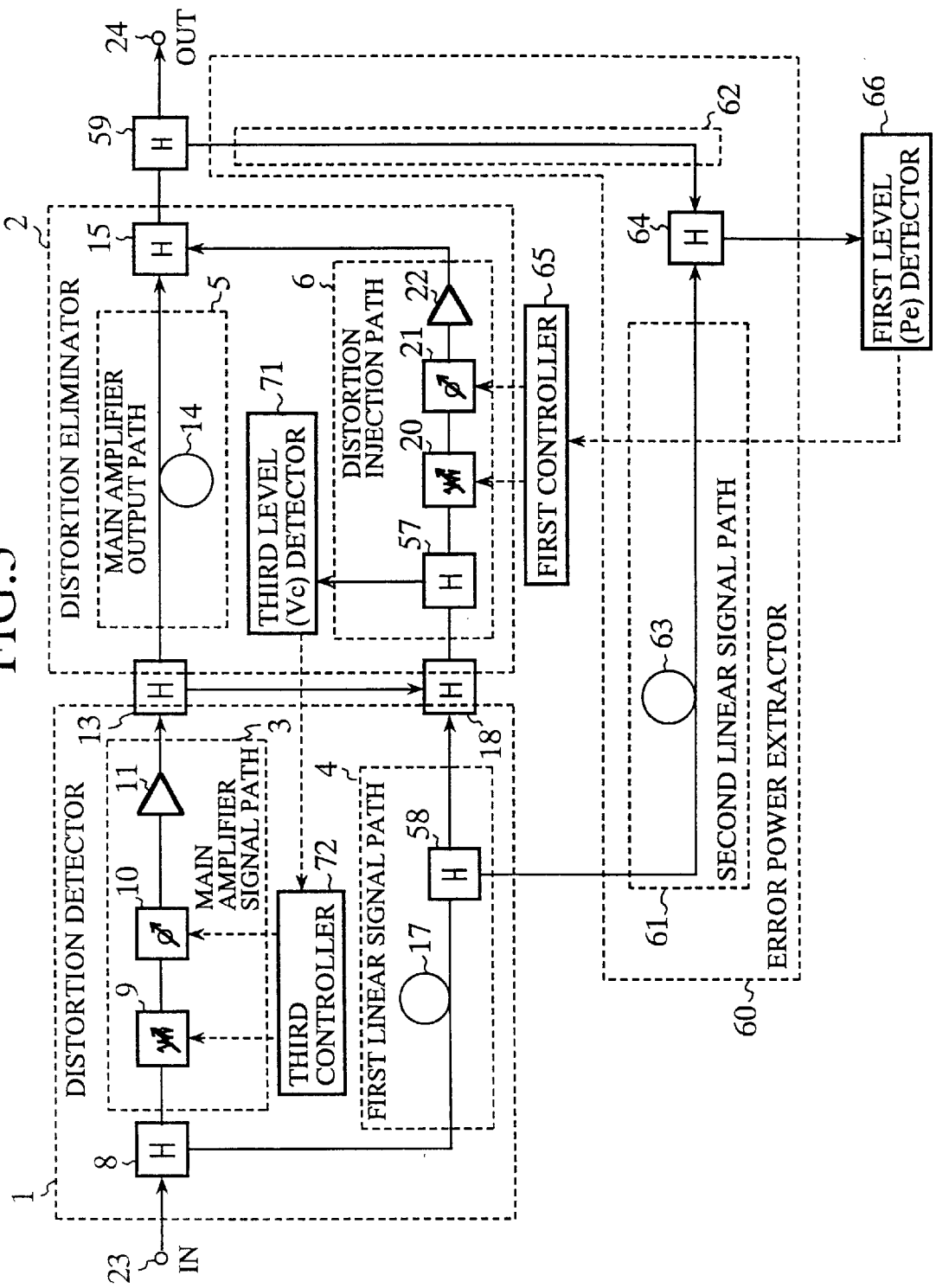
FIG. 3 is a block diagram showing embodiment 3 of the feedforward amplifier in accordance with the present invention.

FIG. 3 is a block diagram showing a configuration of embodiment 3 of the feedforward amplifier in accordance with the present invention, in which the main amplifier signal path 3 in the distortion detector 1 includes a third variable attenuator 9 and a third variable phase shifter 10, and the distortion injection path 6 in the distortion eliminator 2 comprises a directional coupler 57.

In addition, the reference numeral 71 designates a third level (Vc) detector for detecting, when the input signal is employed which includes the control channel signal (Vc) and the main signal (Vs) consisting of the multiple carriers of different frequencies, the control channel signal contained in a signal extracted by the directional coupler 57; and 72 designates a third controller for controlling the electrically controllable third variable attenuator 9 and third variable phase shifter 10 such that the detection value of the third level (Vc) detector 71 is maintained at a minimum. Since the remaining configuration is the same as that of the foregoing embodiment 1, a duplicate description is omitted.

Next, the operation of embodiment 3 will be described.

In embodiment 3, the input signal includes the control channel signal (Vc) and the main signal (Vs) consisting of the multiple carriers of different frequencies, and the directional coupler 57 extract part of the input signal. The third level (Vc) detector 71 detects the control channel signal (Vs) contained in the signal extracted by the directional coupler 57. Then, the third controller 72 controls the third variable attenuator 9 and third variable phase shifter 10 such that the detection value of the third level (Vc) detector 71 is maintained at a minimum.

Thus, embodiment 3 can always combine the output of the main amplifier signal path 3 with that of the first linear signal path 4 in the same amplitude and opposite phases before they are supplied to the distortion injection path 6 in the distortion eliminator 2. The other advantages are similar to those of the foregoing embodiment 1.

Embodiment 4

Figure 4:
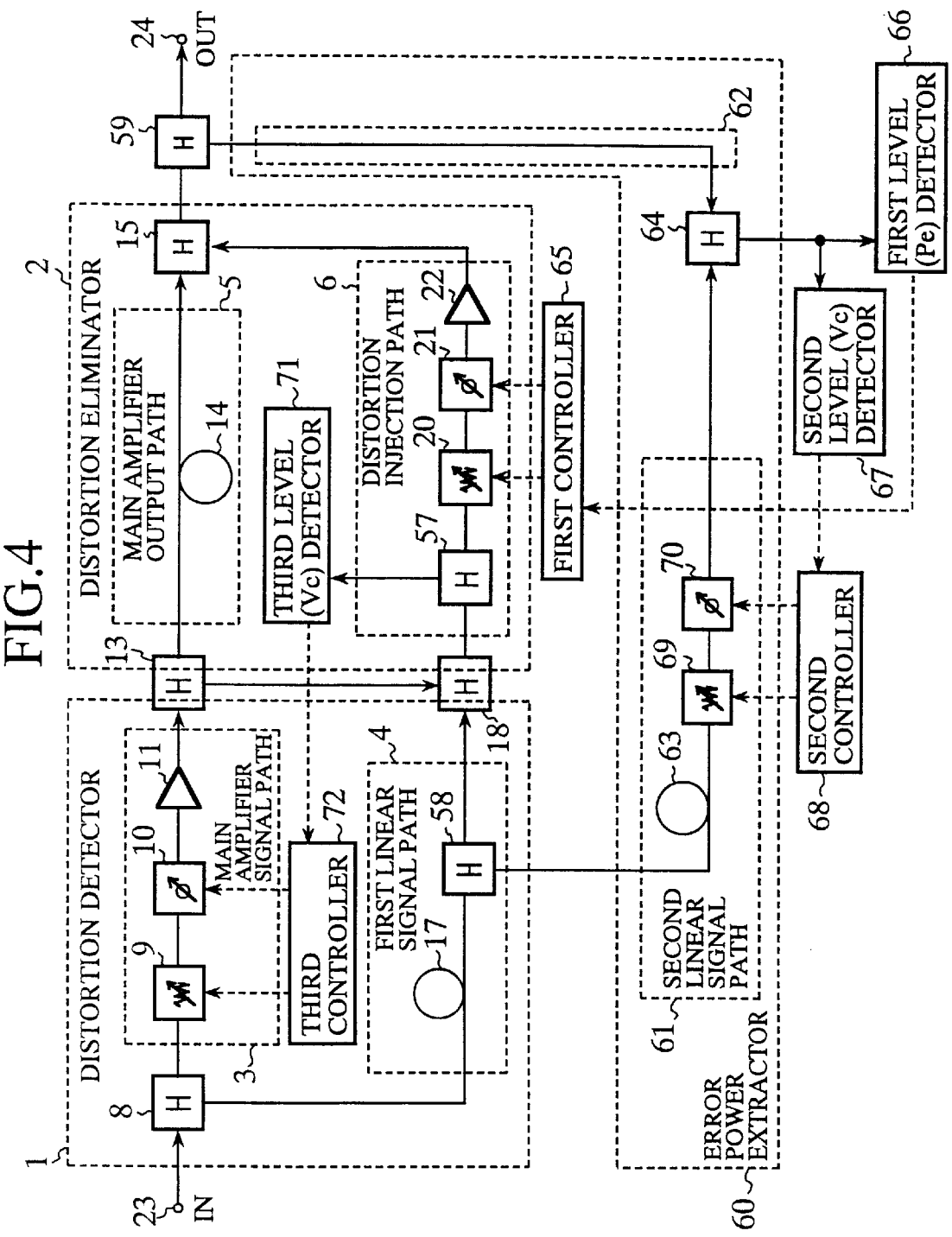
FIG. 4 is a block diagram showing embodiment 4 of the feedforward amplifier in accordance with the present invention.

FIG. 4 is a block diagram showing a configuration of embodiment 4 of the feedforward amplifier in accordance with the present invention, which is a combination of the arrangements of the embodiments 2 and 3. More specifically, the second level (Vc) detector 67, second controller 68, second variable attenuator 69 and second variable phase shifter 70 of the embodiment 2 is combined with the directional coupler 57, third level (Vc) detector 71, third controller 72, third variable attenuator 9 and third variable phase shifter 10 of the embodiment 3. Since the remaining configuration is the same as that of the embodiment 1, a duplicate description is omitted.

According to embodiment 4, the directional coupler 64 can always combine the output of the output reference path 62 with that of the second linear signal path 61 in the same amplitude and opposite phases, and hence the accuracy of the first level (Pe) detector 66 can be maintained at a fixed value independently of the amplitude and phase errors due to the variations in characteristics of the output reference path 62 and second linear signal path 61 in the error power extractor 60. This makes possible maintaining the distortion characteristics of the feedforward amplifier at an optimum state.

In addition, the output of the main amplifier signal path 3 can be always combined with that of the first linear signal path 4 in the same amplitude and opposite phases before they are supplied to the distortion injection path 6 in the distortion eliminator 2.

The other advantages are similar to those of the foregoing embodiment 1.

Embodiment 5

Figure 5:
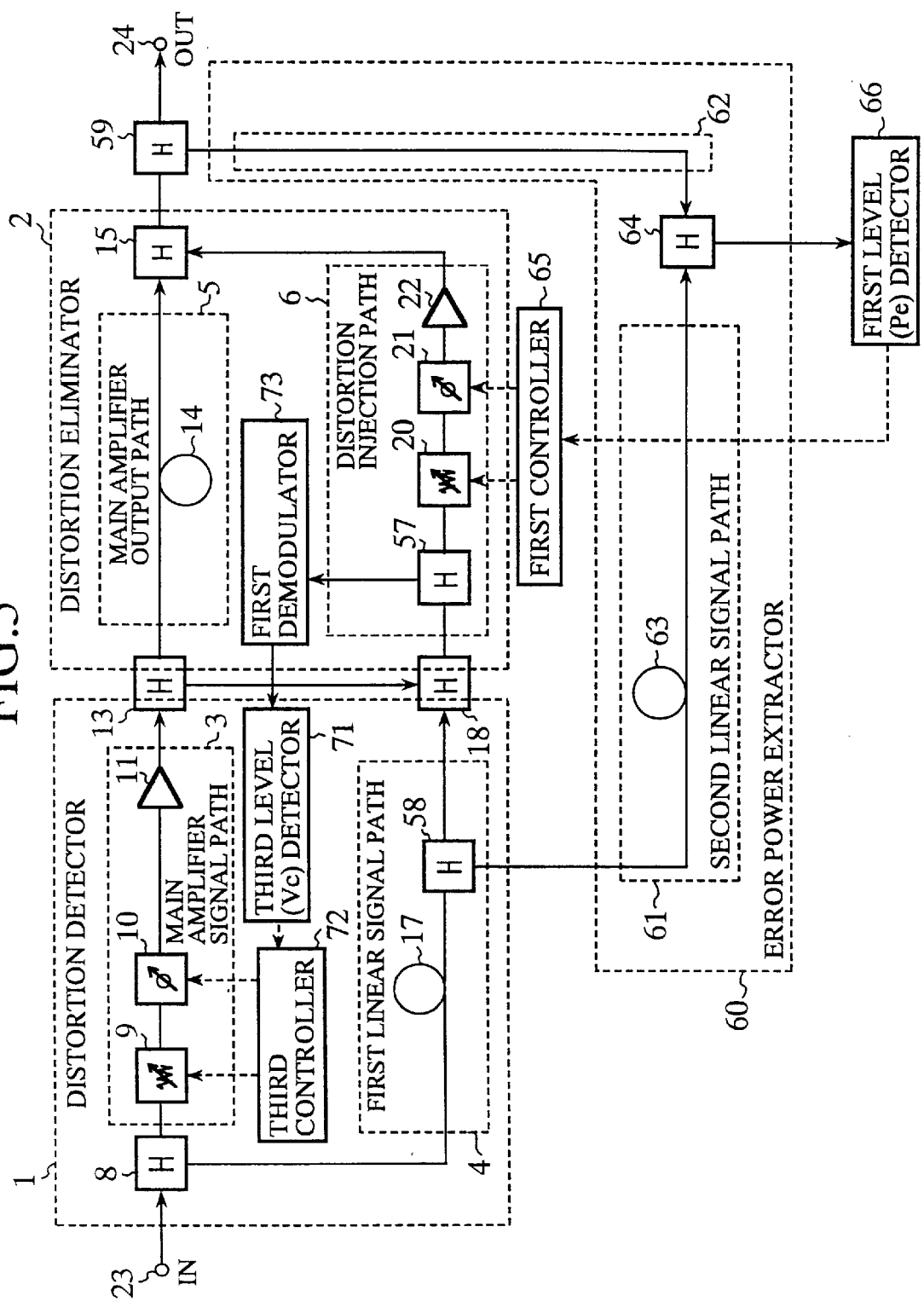
FIG. 5 is a block diagram showing embodiment 5 of the feedforward amplifier in accordance with the present invention.

FIG. 5 is a block diagram showing a configuration of an embodiment 5 of the feedforward amplifier in accordance with the present invention. In FIG. 5, the reference numeral 73 designates a first demodulator that is provided when a CDMA (code division multiple access) modulation signal, which includes the control channel signal (Vc) and the main signal (Vs) consisting of multiple channel signals, is used as the input signal, and that demodulates a part of the CDMA modulation signal which is extracted by the directional coupler 57 in the distortion injection path 6 and corresponds to the control channel signal (Vc). Since the remaining configuration is the same as that of the embodiment 3, a duplicate description thereof is omitted.

Next, the operation of embodiment 5 will be described.

In embodiment 5, the first demodulator 73 demodulates the CDMA modulation signal corresponding to the control channel signal (Vc), when the CDMA modulation signal, which includes the control channel signal (Vc) and the main signal (Vs) consisting of the multiple channel signals, is used as the input signal. Subsequently, the third level (Vc) detector 71 detects the level of the demodulated CDMA modulation signal, and the third controller 72 controls the third variable attenuator 9 and third variable phase shifter 10 such that the detection value of the third level (Vc) detector 71 is kept minimum.

According to embodiment 5, applying the CDMA modulation signal corresponding to the control channel signal (Vc) can make the feedforward amplifier insusceptible to interference such as noise, and heighten the detection sensitivity of the control channel signal (Vc). The other advantages are similar to those of the foregoing embodiment 3.

Embodiment 6

Figure 6:
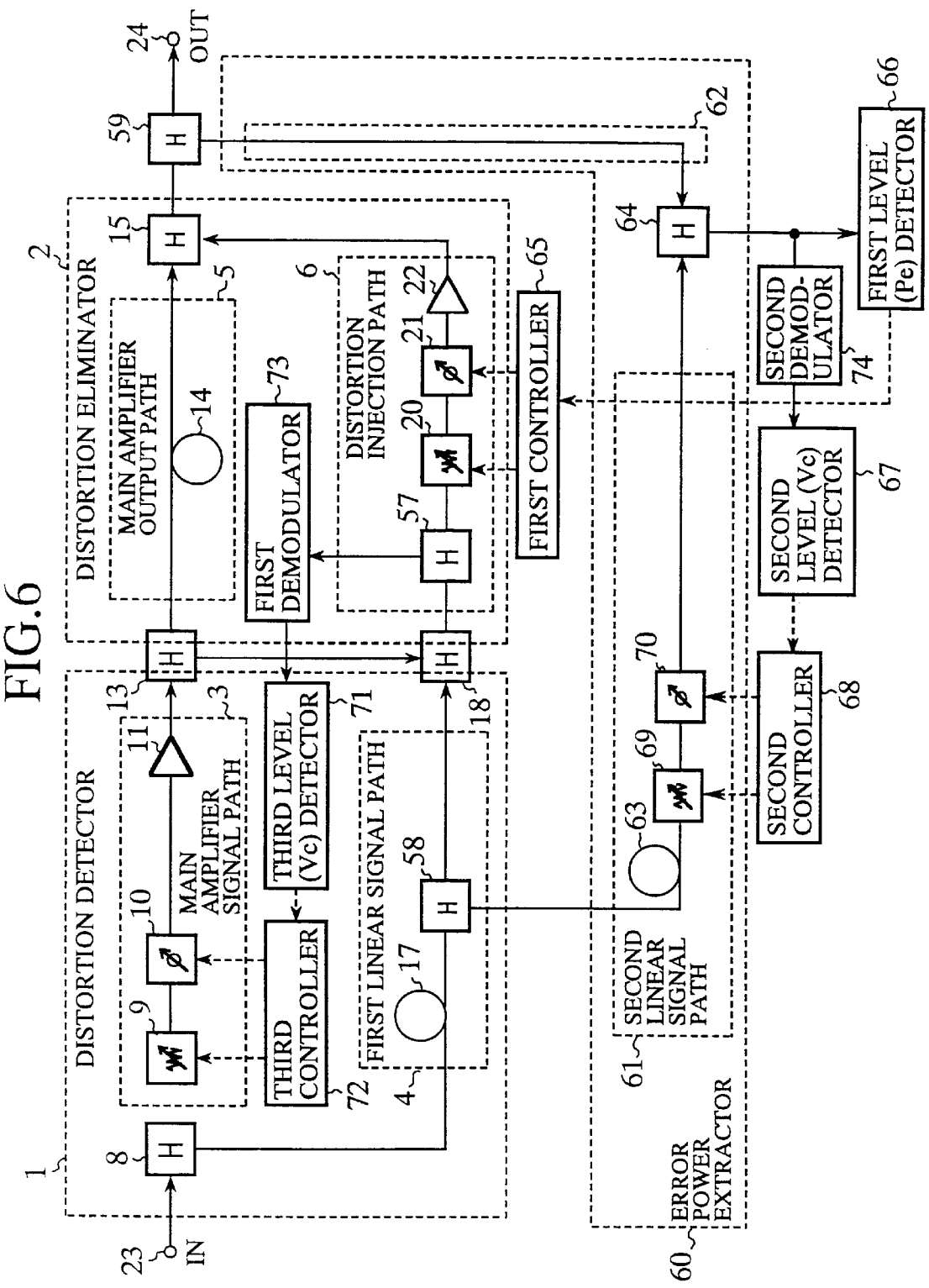
FIG. 6 is a block diagram showing embodiment 6 of the feedforward amplifier in accordance with the present invention.

FIG. 6 is a block diagram showing a configuration of embodiment 6 of the feedforward amplifier in accordance with the present invention. In FIG. 6, the reference numeral 74 designates a second demodulator that is provided when the CDMA modulation signal, which includes the control channel signal (Vc) and the main signal (Vs) consisting of multiple channel signals, is used as the input signal, and that demodulates the combined output of the directional coupler 64 in the error power extractor 60. Since the remaining configuration is the same as that of the embodiment 4 plus the first demodulator 73, a duplicate description thereof is omitted.

Next, the operation of embodiment 6 will be described.

In the present embodiment 6, the second demodulator 74 demodulates the CDMA modulation signal corresponding to the control channel signal (Vc), when the CDMA modulation signal, which includes the control channel signal (Vc) and the main signal (Vs) consisting of the multiple channel signals, is used as the input signal. Subsequently, the second level (Vc) detector 67 detects the level of the demodulated CDMA modulation signal, and the second controller 68 controls the second variable attenuator 69 and second variable phase shifter 70 such that the output value of the second level (Vc) detector 67 is kept minimum.

According to embodiment 6, applying the CDMA modulation signal corresponding to the control channel signal (Vc) can make the feedforward amplifier insusceptible to interference such as noise, and heighten the detection sensitivity of the control channel signal (Vc). The other advantages are similar to those of the foregoing embodiment 4.

Embodiment 7

Figure 7:
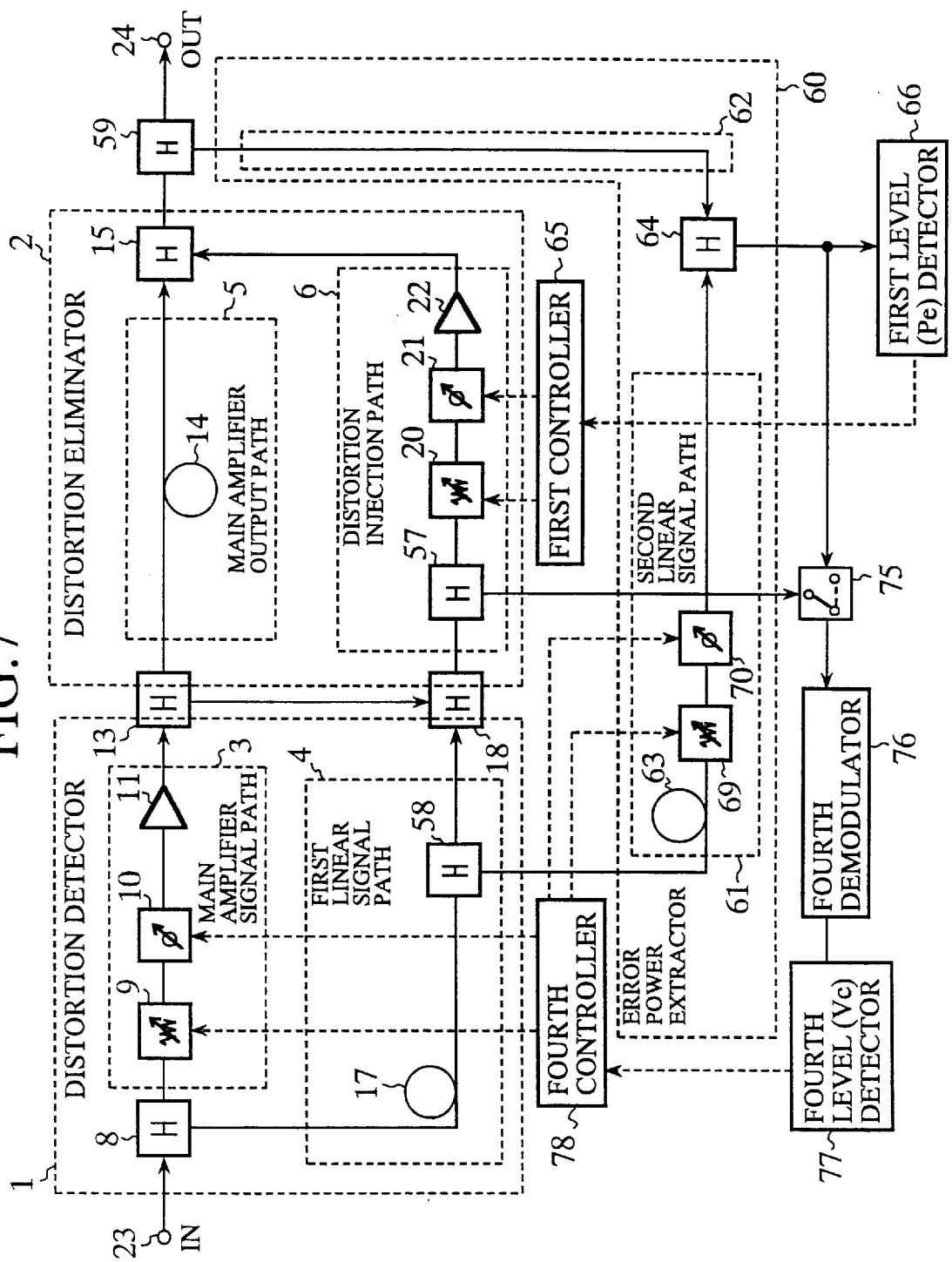
FIG. 7 is a block diagram showing embodiment 7 of the feedforward amplifier in accordance with the present invention.

FIG. 7 is a block diagram showing a configuration of embodiment 7 of the feedforward amplifier in accordance with the present invention. In FIG. 7, the reference numeral 75 designates a switching circuit that is provided when the CDMA modulation signal, which includes the control channel signal (Vc) and the main signal (Vs) consisting of multiple channel signals, is used as the input signal, and that temporally selects one of the CDMA modulation signals included in the combined output from the directional coupler 64 and in the signal extracted by the directional coupler 57.

The reference numeral 76 designates a fourth demodulator for demodulating the CDMA modulation signal corresponding to the control channel signal (Vc) selected by the switching circuit 75; and 77 designates a fourth level (Vc) detector for detecting the CDMA modulation signal demodulated by the fourth demodulator 76.

The reference numeral 78 designates a fourth controller that controls, when the switching circuit 75 selects the CDMA modulation signal output from the directional coupler 64, the second variable attenuator 69 and second variable phase shifter 70 such that the detection value of the fourth level (Vc) detector 77 is kept minimum, and that controls, when the switching circuit 75 selects the CDMA modulation signal output from the directional coupler 57, the third variable attenuator 9 and third variable phase shifter 10 such that the detection value of the fourth level (Vc) detector 77 is kept minimum. Since the remaining configuration is analogous to the configurations of the embodiments 5 and 6, a duplicate description thereof is omitted.

Next, the operation of embodiment 7 will be described.

In embodiment 7, the fourth demodulator 76 demodulates the CDMA modulation signal corresponding to the control channel signal (Vc) supplied from the directional coupler 57 or 64 through the switching circuit 75. Subsequently, the fourth level (Vc) detector 77 detects the level of the demodulated CDMA modulation signal. Then, the fourth controller 78 controls, when the switching circuit 75 connects the output of the directional coupler 64 with the fourth demodulator 76, the second variable attenuator 69 and second variable phase shifter 70 such that the detection value of the fourth level (Vc) detector 77 is maintained at a minimum, and controls, when the switching circuit 75 connects the output of the directional coupler 57 with the fourth demodulator 76, the third variable attenuator 9 and third variable phase shifter 10 such that the detection value of the fourth level (Vc) detector 77 is maintained at a minimum.

According to embodiment 7, the output of the main amplifier signal path 3 can be combined with the output of the first linear signal path 4 in the same amplitude and opposite phases before they are supplied to the distortion injection path 6 in the distortion eliminator 2. Likewise, the output of the output reference path 62 can be combined with the output of the second linear signal path 61 by the directional coupler 64 in the same amplitude and opposite phases.

In addition, the accuracy of the first level (Pe) detector 66 can be maintained at a fixed value independently of the amplitude and phase errors due to the variations in characteristics of the output reference path 62 and second linear signal path 61 in the error power extractor 60. This makes possible maintaining the distortion characteristics of the feedforward amplifier at an optimum state.

Moreover, using the switching circuit 75 enables the first demodulator 73 and second demodulator 74, the third level (Vc) detector 71 and second level (Vc) detector 67, and the third controller 72 and second controller 68, each pair of which is provided separately in the foregoing embodiment 6, to be incorporated into the fourth demodulator 76, fourth level (Vc) detector 77 and fourth controller 78, respectively, in embodiment 7. This can reduce the size of the device. The remaining advantages are similar to those of the embodiment 1.

Embodiment 8

Figure 8:
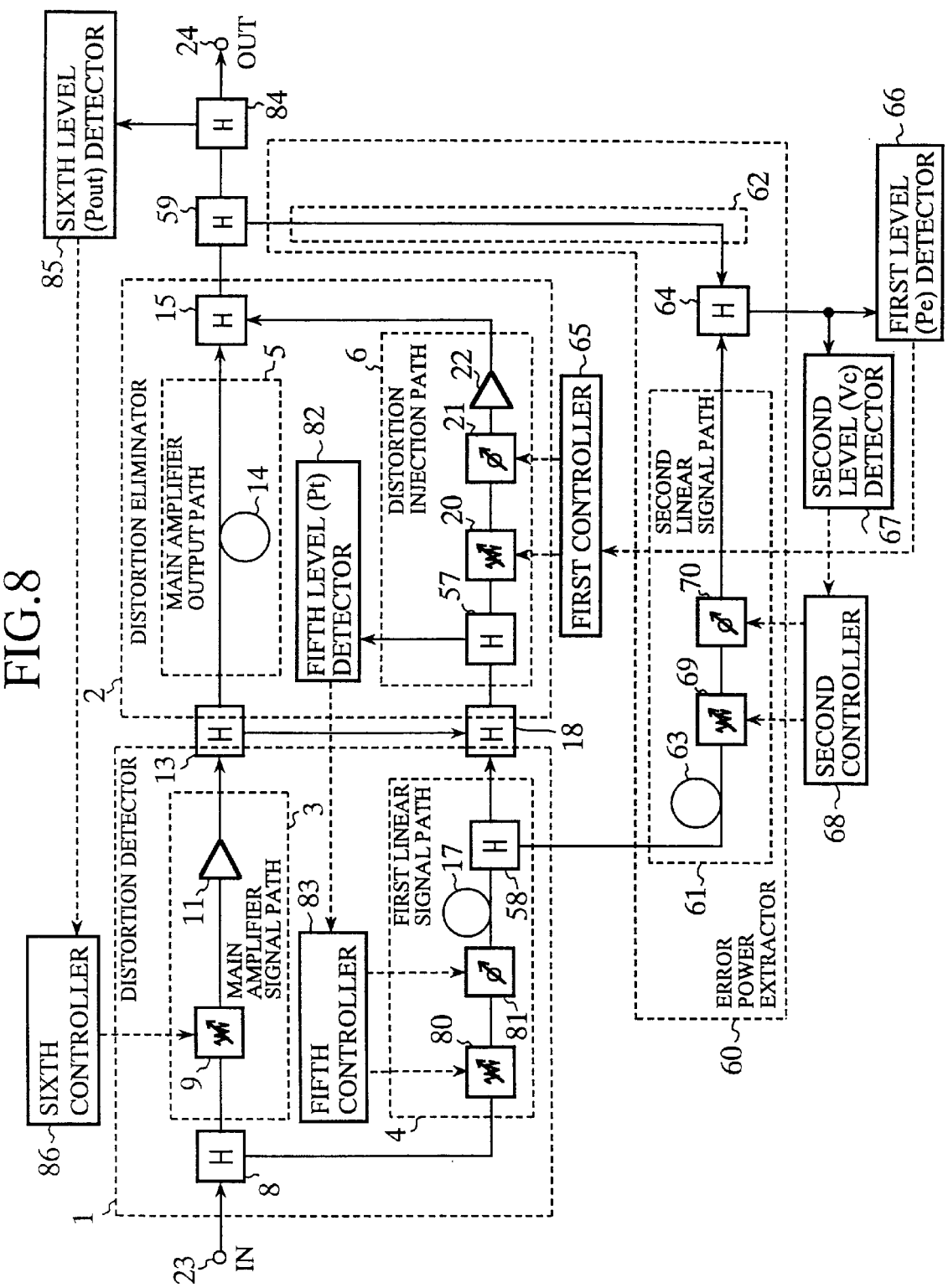
FIG. 8 is a block diagram showing embodiment 8 of the feedforward amplifier in accordance with the present invention.

FIG. 8 is a block diagram showing a configuration of an embodiment 8 of the feedforward amplifier in accordance with the present invention, in which the first linear signal path 4 includes a fourth variable attenuator 80 and a fourth variable phase shifter 81. The reference numeral 82 designates a fifth level (Pt) detector for detecting, when the control channel signal (Vc) and the main signal consisting of the multiple carriers of different frequencies are used as the input signal, the control channel signal (Vc) contained in the signal extracted by the directional coupler 57; and 83 designates a fifth controller for controlling the electrically controllable fourth variable attenuator 80 and fourth variable phase shifter 81 such that the detection level of the fifth level (Pt) detector 82 is maintained at a minimum.

The reference numeral 84 designates a directional coupler provided between the distortion eliminator 2 and the output terminal 24; 85 designates a sixth level (Pout) detector for detecting from the directional coupler 84 the output power (Pout) of the feedforward amplifier; and 86 designates a sixth controller for controlling the third variable attenuator 9 provided in the main amplifier signal path 3 of the distortion detector 1 such that the detection value of the sixth level (Pout) detector 85 is maintained at a fixed value. Since remaining configuration is the same as that of FIG. 2, a duplicate description thereof is omitted here.

Next, the operation of embodiment 8 will be described.

In embodiment 8, the directional coupler 57 extracts part of the input signal containing the control channel signal (Vc) and the main signal consisting of the multiple carriers of different frequencies, and the fifth level (Pt) detector 82 detects the control channel signal (Vc) included in that extracted signal. Then, the fifth controller 83 controls the fourth variable attenuator 80 and fourth variable phase shifter 81 such that the detection level of the fifth level (Pt) detector 82 is maintained at a minimum.

Furthermore, the sixth level (Pout) detector 85 detects the output power (Pout) of the feedforward amplifier fed from the directional coupler 84 immediately previous to the output terminal 24, and the sixth controller 86 controls the third variable attenuator 9 interposed in the main amplifier signal path 3 of the distortion detector 1 such that the detection level of the sixth level (Pout) detector 85 is maintained at a fixed value.

According to embodiment 8, the output of the main amplifier signal path 3 can be always combined with the output of the first linear signal path 4 in the same amplitude and opposite phases before they are supplied to the distortion injection path 6 of the distortion eliminator 2. In addition, the output power of the feedforward amplifier can be maintained at a fixed level by keeping the detection value of the sixth level (Pout) detector 85 at a fixed level. The other advantages are similar to those of embodiment 2.

Embodiment 9

Figure 9:
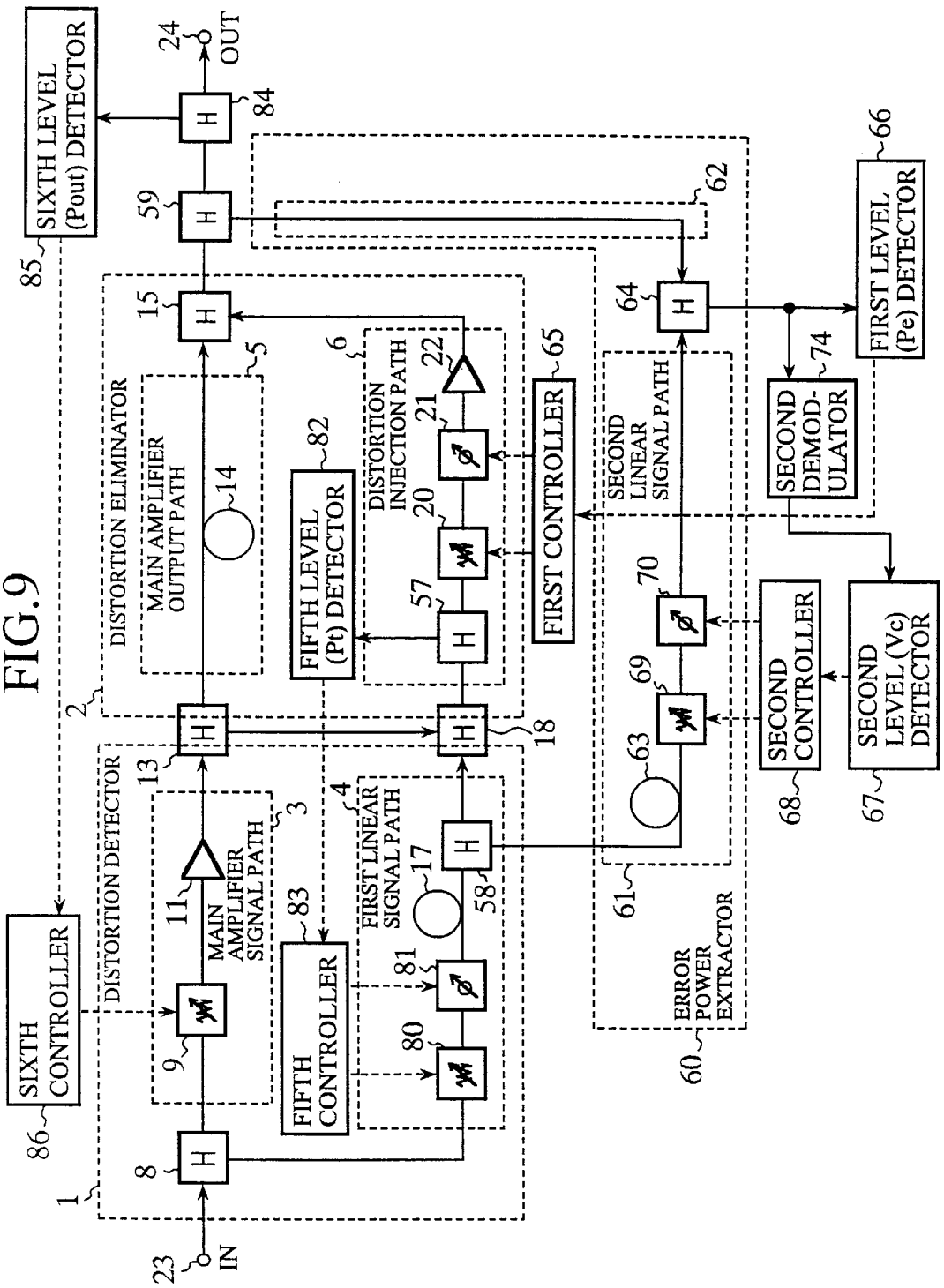
FIG. 9 is a block diagram showing embodiment 9 of the feedforward amplifier in accordance with the present invention.

FIG. 9 is a block diagram showing a configuration of embodiment 9 of the feedforward amplifier in accordance with the present invention, which comprises the second demodulator 74 as shown in embodiment 6 in addition to configuration of the embodiment 8.

Next, the operation of embodiment 9 will be described.

In embodiment 9, the second demodulator 74 demodulates the CDMA modulation signal corresponding to the control channel signal (Vc), when the CDMA modulation signal, which includes the control channel signal (Vc) and the main signal (Vs) consisting of the multiple channel signals, is used as the input signal. Thus, the second level (Vc) detector 67 detects the level of the demodulated CDMA modulation signal, and the second controller 68 controls the second variable attenuator 69 and second variable phase shifter 70 such that the output value of the second level (Vc) detector 67 is kept minimum.

According to embodiment 9, applying the CDMA modulation signal corresponding to the control channel signal (Vc) can make the feedforward amplifier insusceptible to interference such as noise, and heighten the detection sensitivity of the control channel signal (Vc). The other advantages are similar to those of the foregoing embodiment 8.

Embodiment 10

Figure 10:
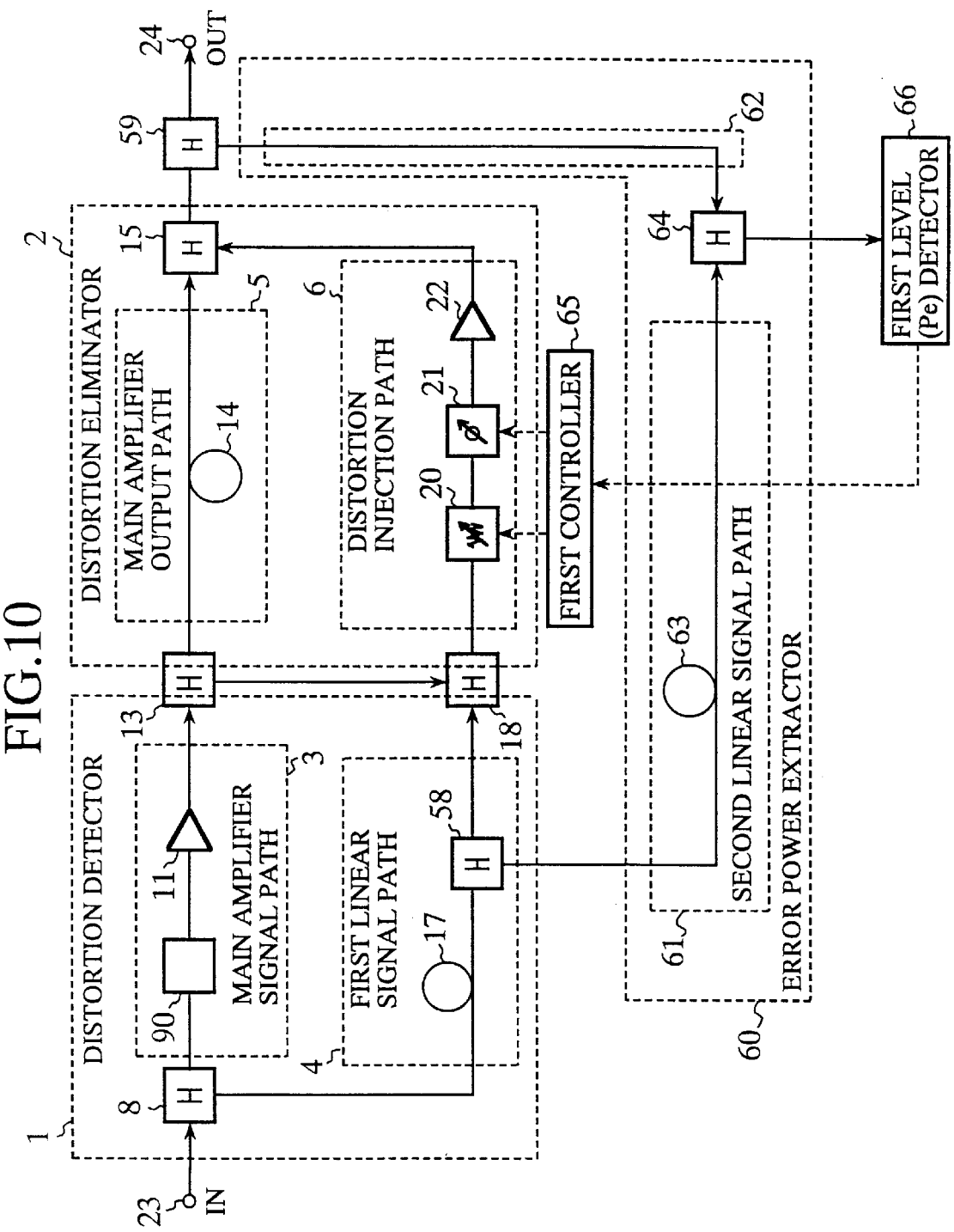
FIG. 10 is a block diagram showing embodiment 10 of the feedforward amplifier in accordance with the present invention.

FIG. 10 is a block diagram showing a configuration of embodiment 10 of the feedforward amplifier in accordance with the present invention, in which the reference numeral 90 designates a first linearizer that is provided in the main amplifier signal path 3 in the distortion detector 1 to compensates for the distortion characteristics of the main amplifier 11. Since the remaining configuration is the same as that of embodiment 1, a duplicate description is omitted.

Next, the operation of embodiment 10 will be described.

In embodiment 10, the signal which is supplied to the main amplifier signal path 3 in the distortion detector 1 passes through the first linearizer 90, and is amplified by the main amplifier 11. In the course of this, the distortion characteristics of the main amplifier 11 are compensated by the first linearizer 90 because of the amplitude and phase characteristics of the first linearizer 90 reversal to those of the main amplifier 11.

According to embodiment 10, the distortion characteristics of the main amplifier 11 can be compensated by the first linearizer 90. This enables the distortion characteristics of the feedforward amplifier to be improved. The other advantages are similar to those of embodiment 1.

Embodiment 11

Figure 11:
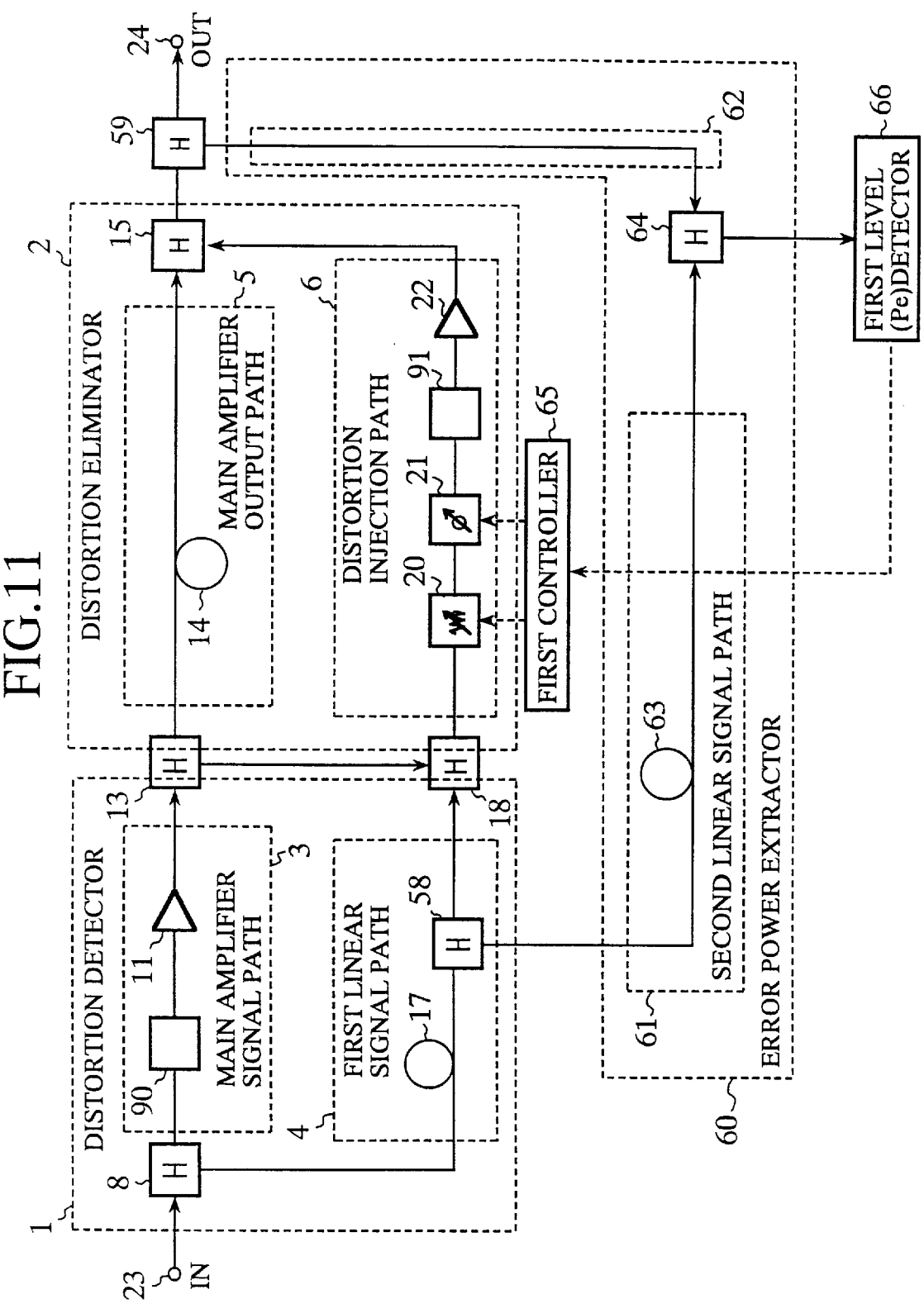
FIG. 11 is a block diagram showing embodiment 11 of the feedforward amplifier in accordance with the present invention.
Figure 12:
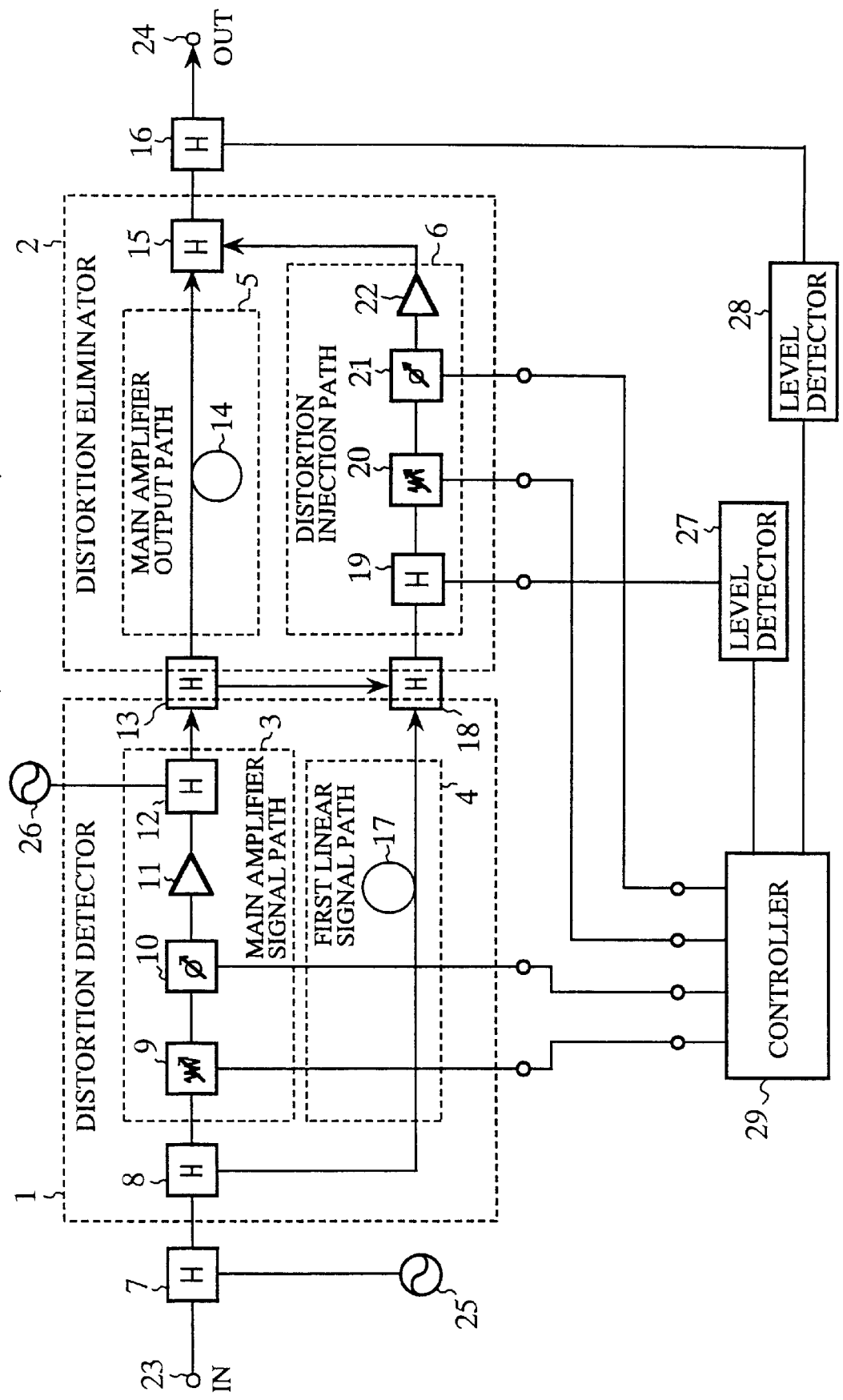
FIG. 12 is a block diagram showing a basic configuration of a first conventional feedforward amplifier.
Figure 13:
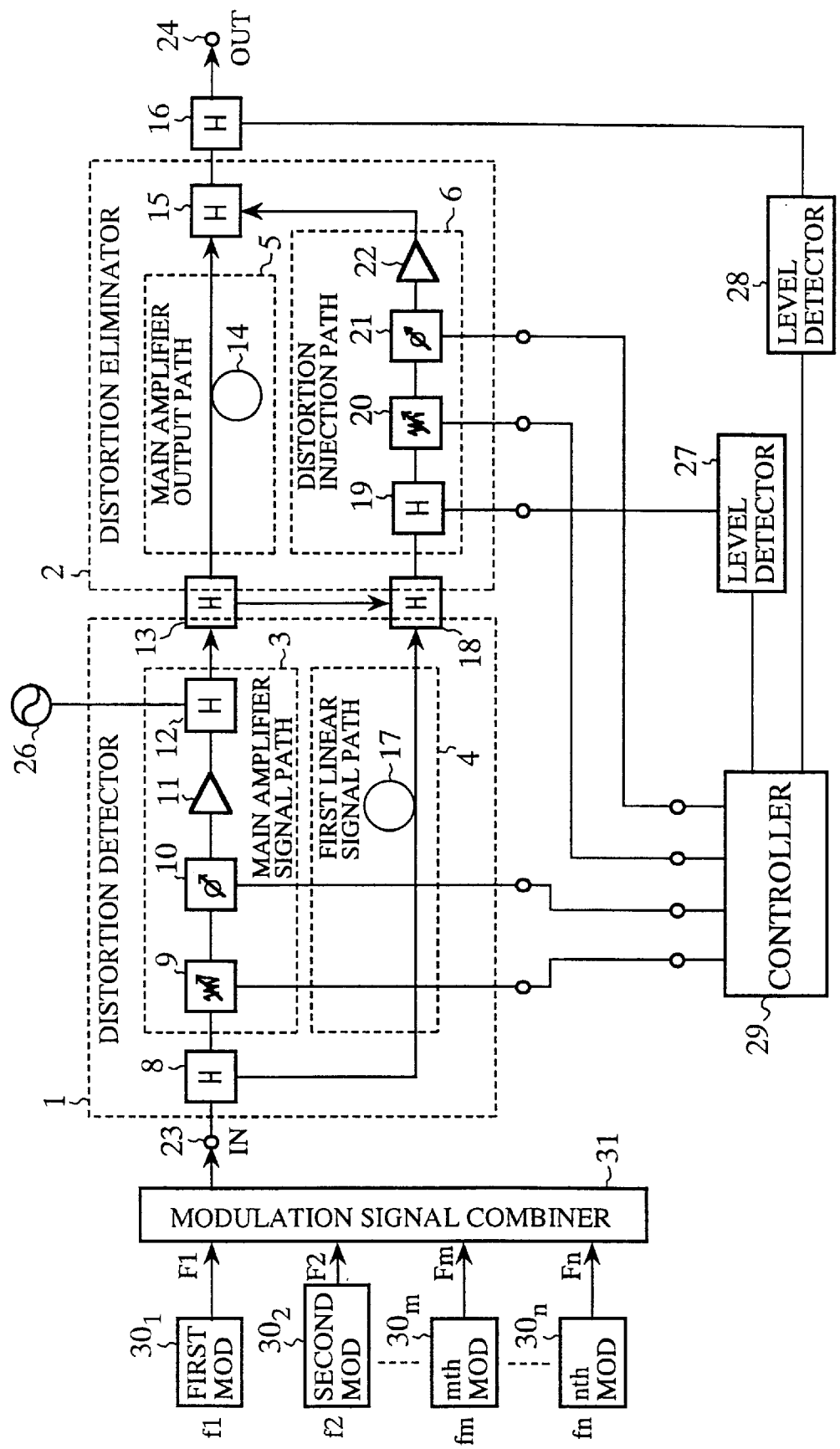
FIG. 13 is a block diagram showing a basic configuration of a second conventional feedforward amplifier.
Figure 14:
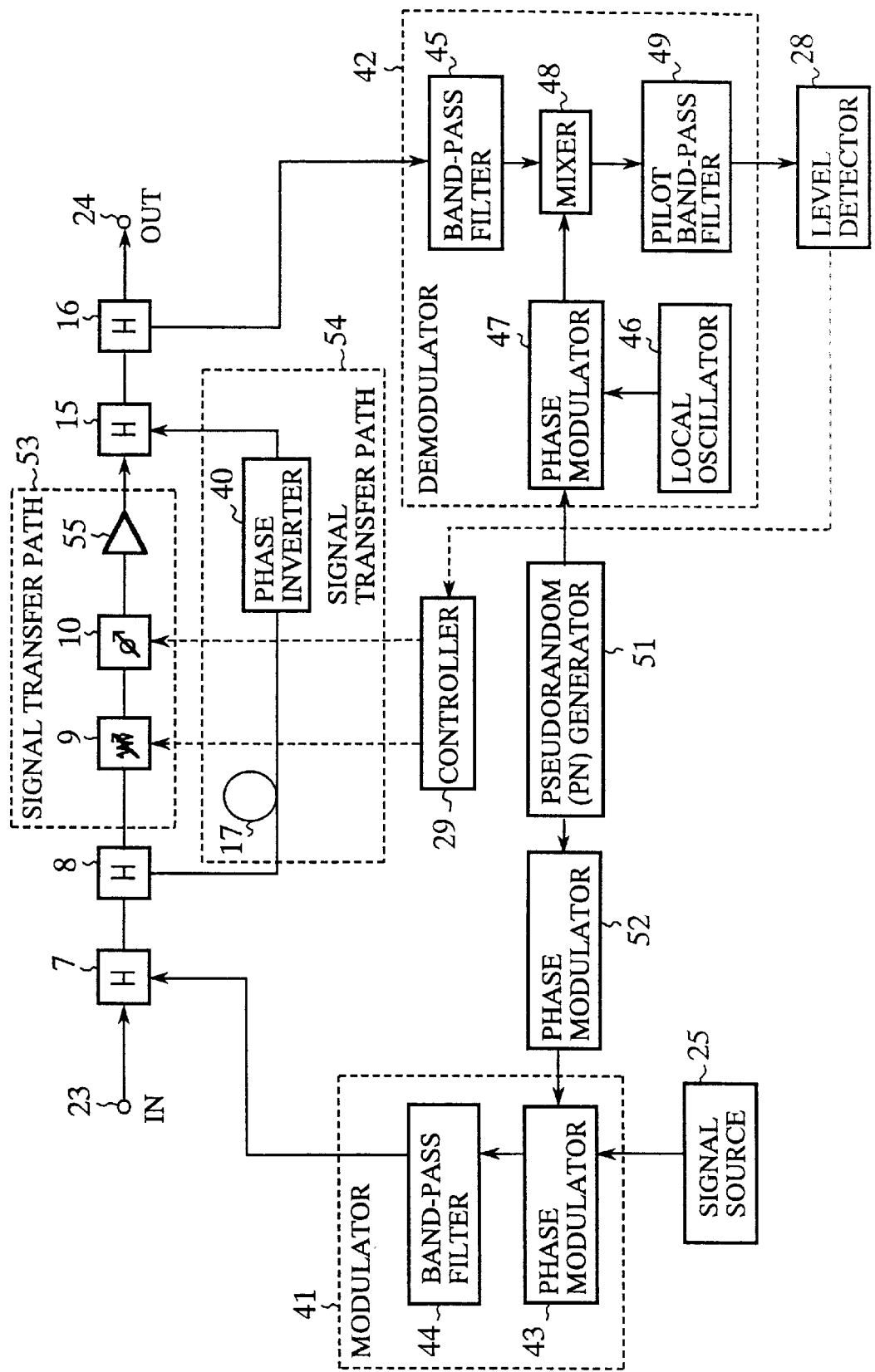
FIG. 14 is a block diagram showing a basic configuration of a third conventional feedforward amplifier.

FIG. 11 is a block diagram showing a configuration of embodiment 11 of the feedforward amplifier in accordance with the present invention, in which the reference numeral 91 designates a second linearizer that is provided in the distortion injection path 6 of the distortion eliminator 2 to compensate for the distortion characteristics of the sub-amplifier 22. Since the remaining configuration is the same as that of embodiment 10, a duplicate description is omitted.

Next, the operation of embodiment 11 will be described.

In embodiment 11, the signal which is supplied to the distortion injection path 6 in the distortion eliminator 2 passes through the second linearizer 91, and is amplified by the sub-amplifier 22. In the course of this, the distortion characteristics of the sub-amplifier 22 are compensated by the second linearizer 91 because of the amplitude and phase characteristics of the second linearizer 91 reversal to those of the sub-amplifier 22.

According to embodiment 11, the distortion characteristics of the sub-amplifier 22 can be compensated by the second linearizer 91. This enables the distortion characteristics of the feedforward amplifier to be improved. The other advantages are similar to those of the embodiment 2.

What is claimed is:

1. A feedforward amplifier comprising:

a distortion detector that includes a main amplifier signal path containing a main amplifier, and a first linear signal path containing a first delay circuit and a directional coupler, coupled to an output of said first delay circuit;

a distortion eliminator that includes a main amplifier output path containing a second delay circuit, and a distortion injection path containing a first variable attenuator, first variable phase shifter and a sub-amplifier, and that cancels out nonlinear distortion components, which are generated by said main amplifier and detected by said distortion detector, by injecting into an output of said main amplifier an output of said sub-amplifier which amplifies the nonlinear distortion components;

an error power extractor for extracting output error power due to variations in said distortion eliminator by combining in opposite phases an output signal of said distortion eliminator with a signal from said first linear signal path in said distortion detector;

a first level detector for detecting the output error power extracted by said error power extractor;

a first controller for controlling said first variable attenuator and said first variable phase shifter in said distortion eliminator such that the output error power detected by said first level detector is maintained at a minimum;

wherein said main amplifier signal path further includes a third variable attenuator and a third variable phase shifter; and wherein said feedforward amplifier further comprises a third level detector for detecting, when an input signal to said feedforward amplifier includes a control channel signal and a main signal consisting of multiple carriers of different frequencies, the control channel signal from said distortion injection circuit; and a third controller for controlling said third variable attenuator and said third variable phase shifter in said main amplifier signal path such that the control signal detected by said third level detector is maintained at a minimum.

2. The feedforward amplifier as claimed in claim 1, wherein said error power extractor comprises a second linear signal path that includes a second variable attenuator and a second variable phase shifter and is connected to said first linear signal path, and extracts the control channel signal, and wherein said feedforward amplifier further comprises a second level detector for detecting the control channel signal extracted by said error power extractor; and a second controller for controlling said second variable attenuator and said second variable phase shifter in said second linear signal path such that the control channel signal detected by said second level detector is maintained at a minimum.

3. The feedforward amplifier as claimed in claim 1, further comprising a first demodulator that extracts, when a CDMA modulation signal which includes the control channel signal and the main signal consisting of multiple channel signals is used as the input signal, a CDMA modulation signal corresponding to the control channel signal from said distortion injection circuit, demodulates the extracted CDMA modulation signal, and supplies it to said third level detector.

4. The feedforward amplifier as claimed in claim 2, wherein said error power extractor extracts, when using as the input signal a CDMA modulation signal including the control channel signal and the main signal containing multiple channel signals, a CDMA modulation signal corresponding to the control channel signal, and wherein said feedforward amplifier further comprises a second demodulator for demodulating the CDMA modulation signal extracted by said error power extractor, and supplies the demodulated signal to said second level detector.

5. A feedforward amplifier comprising:
a distortion detector that includes a main amplifier signal path containing a main amplifier, and a first linear signal path containing a first delay circuit and a directional coupler, coupled to an output of said first delay circuit;
a distortion eliminator that includes a main amplifier output path containing a second delay circuit, and a distortion injection path containing a first variable attenuator, first variable phase shifter and a sub-amplifier, and that cancels out nonlinear distortion components, which are generated by said main amplifier and detected by said distortion detector, by injecting into an output of said main amplifier an output of said sub-amplifier which amplifies the nonlinear distortion components;
an error power extractor for extracting output error power due to variations in said distortion eliminator by combining in opposite phases an output signal of said distortion eliminator with a signal from said first linear signal path in said distortion detector;
a first level detector for detecting the output error power extracted by said error power extractor;
a first controller for controlling said first variable attenuator and said first variable phase shifter in said distortion eliminator such that the output error power detected by said first level detector is maintained at a minimum;

wherein said main amplifier signal path of said distortion detector further includes a third variable attenuator and a third variable phase shifter; and said error power extractor includes a second linear signal path that is connected to said first linear signal path and includes a second linear signal path containing a second attenuator and a second variable phase shifter, and wherein said feedforward amplifier further comprises:
a switching circuit for selecting, when using as an input signal a CDMA modulation signal including a control channel signal and a main signal containing multiple channel signals, a CDMA modulation signal corresponding to the control channel signal from one of said distortion injection path and said error power extractor;
a fourth demodulator for demodulating the CDMA modulation signal selected by said switching circuit;
a fourth level detector for detecting the CDMA modulation signal demodulated by said fourth demodulator; and
a fourth controller for controlling, when said switching circuit selects the CDMA modulation signal from said error power extractor, said second variable attenuator and said second variable phase shifter which are interposed in said second linear signal path such that the CDMA modulation signal detected by said fourth level detector is kept minimum, and for controlling, when said switching circuit selects the CDMA modulation signal from said distortion injection path, said third variable attenuator and said third variable phase shifter which are interposed in said main amplifier signal path such that the CDMA modulation signal detected by said fourth level detector is kept minimum.

6. A feedforward amplifier comprising:
a distortion detector that includes a main amplifier signal path containing a main amplifier, and a first linear signal path containing a first delay circuit and a directional coupler, coupled to an output of said first delay circuit;
a distortion eliminator that includes a main amplifier output path containing a second delay circuit, and a distortion injection path containing a first variable attenuator, first variable phase shifter and a sub-amplifier, and that cancels out nonlinear distortion components, which are generated by said main amplifier and detected by said distortion detector, by injecting into an output of said main amplifier an output of said sub-amplifier which amplifies the nonlinear distortion components;
an error power extractor for extracting output error power due to variations in said distortion eliminator by combining in opposite phases an output signal of said distortion eliminator with a signal from said first linear signal path in said distortion detector;
a first level detector for detecting the output error power extracted by said error power extractor;
a first controller for controlling said first variable attenuator and said first variable phase shifter in said distortion eliminator such that the output error power detected by said first level detector is maintained at a minimum; and
wherein said error power extractor comprises a second linear signal path that includes a second variable attenuator and a second variable phase shifter and is connected to said first linear signal path, and extracts, when an input signal to said feedforward amplifier includes a control channel signal and a main signal consisting of multiple carriers of different frequencies, the control channel signal, and wherein said feedforward amplifier further comprises a second level detector for detecting the control channel signal extracted by said error power extractor; and a second controller for controlling said second variable attenuator and said second variable phase shifter in said error power extractor such that the control channel signal detected by said second level detector is maintained at a minimum;

wherein said main amplifier signal path in said distortion detector further includes a third variable attenuator; and said first linear signal path in said distortion detector further includes a fourth variable attenuator and a fourth variable phase shifter, and wherein said feedforward amplifier further comprises:
- a fifth level detector for detecting said control channel signal from said distortion injection path;
- a fifth controller for controlling said fourth variable attenuator and said fourth variable phase shifter which are interposed in said first linear signal path such that the control channel signal detected by said fifth level detector is maintained at a minimum;
- a six level detector for detecting an output signal of said distortion eliminator; and
- a sixth controller for controlling said third variable attenuator which is interposed in said main amplifier signal path such that the output signal detected by said sixth level detector is maintained at a fixed value.

7. The feedforward amplifier as claimed in claim 6, wherein said error power extractor extracts, when using as the input signal a CDMA modulation signal including the control channel signal and the main signal containing multiple channel signals, a CDMA modulation signal corresponding to the control channel signal, and wherein said feedforward amplifier further comprises a second demodulator for demodulating the CDMA modulation signal extracted by said error power extractor, and supplies the demodulated signal to said second level detector.

8. The feedforward amplifier as claimed in claim 1, wherein said main amplifier signal path of said distortion detector further comprises a first linearizer for compensating for distortion characteristics of said main amplifier.

9. The feedforward amplifier as claimed in claim 1, wherein said distortion injection path of said distortion eliminator further comprises a second linearizer for compensating for distortion characteristics of said sub-amplifier.

10. The feedforward amplifier as claimed in claim 4, further comprising a first demodulator that extracts from said distortion injection circuit the CDMA modulation signal corresponding to the control channel signal, demodulates the extracted CDMA modulation signal, and supplies it to said third level detector.

* * * * *